(12) United States Patent
Zhang et al.

(10) Patent No.: US 9,331,701 B1
(45) Date of Patent: May 3, 2016

(54) RECEIVERS AND METHODS OF ENABLING THE CALIBRATION OF CIRCUITS RECEIVING INPUT DATA

(71) Applicant: Xilinx, Inc., San Jose, CA (US)

(72) Inventors: Xiaoqian Zhang, San Jose, CA (US); Terence Magee, San Francisco, CA (US)

(73) Assignee: XILINX, INC., San Jose, CA (US)

( * ) Notice: Subject to any disclaimer, the term of this patent is extended or adjusted under 35 U.S.C. 154(b) by 57 days.

(21) Appl. No.: 14/302,231

(22) Filed: Jun. 11, 2014

(51) Int. Cl.
*H03L 7/00* (2006.01)

(52) U.S. Cl.
CPC ........................................ *H03L 7/00* (2013.01)

(58) Field of Classification Search
None
See application file for complete search history.

(56) References Cited

U.S. PATENT DOCUMENTS

| 7,236,026 | B1 | 6/2007 | Samad et al. | |
|---|---|---|---|---|
| 7,635,997 | B1 | 12/2009 | Samad | |
| 9,059,825 | B2* | 6/2015 | Chi et al. | |
| 2002/0196883 | A1* | 12/2002 | Best et al. | 375/355 |
| 2007/0217559 | A1* | 9/2007 | Stott et al. | 375/355 |
| 2009/0290671 | A1* | 11/2009 | Rea et al. | 375/371 |
| 2010/0271092 | A1* | 10/2010 | Zerbe et al. | 327/161 |
| 2012/0033514 | A1* | 2/2012 | Best | 365/193 |

* cited by examiner

*Primary Examiner* — Cassandra Cox
(74) *Attorney, Agent, or Firm* — John J. King

(57) ABSTRACT

A data interface enabling the calibration of input data comprises a first data receiver having a first plurality of input data lines coupled to receive a corresponding first plurality of data bits associated with a data bus, the first data receiver having a first control circuit enabling calibration of the first plurality of input data lines; and a second data receiver having a second plurality of input data lines coupled to receive a corresponding second plurality of data bits associated with the data bus, the second data receiver having a second control circuit enabling calibration of the second plurality of data lines. The first plurality of input data lines of the first data receiver are calibrated in parallel with the second plurality of input data lines of the second data receiver.

18 Claims, 10 Drawing Sheets

RECEIVERS AND METHODS OF ENABLING THE CALIBRATION OF CIRCUITS RECEIVING INPUT DATA

TECHNICAL FIELD

The present invention relates generally to integrated circuit devices, and in particular, to receivers and methods of enabling the calibration of circuits receiving input data in an integrated circuit device.

BACKGROUND

Signals in digital circuits typically have one driver pin and one or more load pins. A logic transition on a signal during circuit operation commences at the driver of the signal and is received at a load pin at some point later in time. The propagation delay from a signal driver to the load pin depends on the routing topology, capacitance, and buffering in the signal path, and may vary based upon a selected path. This important signal transmission property, called the signal "skew," represents the difference in propagation delay of a signal routed to a load in different paths. Similarly, "clock skew" refers to skew on the clock network. Clock skew can have a considerable impact on the performance of sequential logic circuits, and can often reduce the performance of sequential circuits by reducing the permissible propagation time for combinational paths.

In an ultra-wide data bus memory interface, such as 72-bit or 144-bit QDRII or RLDRAM memory interfaces, common input data clock signals are shared across multiple input data bits. However, the skew between input clock signals and data may be large because shared clock signals physically travel across the chip to receive multiple data bits. Although existing calibration approaches can minimize skew before memory transactions can be launched, calibration time associated with existing calibration approaches is proportional with a data bus width.

Therefore, there exists a need to calibrate an ultra-wide data bus memory interface with minimum calibration time.

SUMMARY

A data interface enabling the calibration of circuits receiving input data is disclosed. The data interface comprises a first data receiver having a first plurality of input data lines coupled to receive a corresponding first plurality of data bits associated with a data bus, the first data receiver having a first control circuit enabling a calibration of the first plurality of input data lines; and a second data receiver having a second plurality of input data lines coupled to receive a corresponding second plurality of data bits associated with the data bus, the second data receiver having a second control circuit enabling a calibration of the second plurality of input data lines. The first plurality of input data lines of the first data receiver are calibrated in parallel with the second plurality of input data lines of the second data receiver.

A data interface enabling the calibration of circuits receiving input data according to another implementation comprises a first data receiver having a first plurality of input data lines coupled to receive a corresponding first nibble of data associated with a data bus and to receive a reference clock signal, the first data receiver comprising a routing circuit for generating an inter-nibble clock signal; and a second data receiver having a second plurality of input data lines coupled to receive a corresponding second nibble of data associated with the data bus and to receive the inter-nibble clock signal from the first data receiver. The first plurality of input data lines are calibrated using the reference clock signal, and the second plurality of input data lines are calibrated using the inter-nibble clock signal.

A method of enabling the calibration of circuits receiving input data is also described. The method comprises receiving a first plurality of data bits associated with a data bus at a first plurality of input data lines of a first data receiver; receiving a second plurality of data bits associated with the data bus at a second plurality of input data lines of a second data receiver; and calibrating the first plurality of input data lines of the first data receiver in parallel with the second plurality of input data lines of the second data receiver.

Other features will be recognized from consideration of the Detailed Description and Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods set forth below address the need for calibrating an ultra-wide data bus memory interface, where common clock signals are used across multiple memory bits. The circuits and methods provide a systematic approach with multiple nibble-based calibration finite state machines (FSMs) running in parallel and a daisy-chained synchronization circuits implemented among multiple nibbles. By running multiple nibble-based calibration circuits in parallel and synchronized with each other, calibration time could be constant with variable data bus width and each nibble calibration is scalable and agnostic to specific memory system configurations. Calibration time will vary depending upon width if the reference clock has to travel further via inter-nibble or inter-byte inputs. Within a single nibble receiver, the calibration time of its FSM depends on the relative skew between the clock path and the data path from the point where the reference clock is injected into these paths.

Unlike conventional clock calibration methods where all input data bit paths are calibrated sequentially and the calibration time is proportional with the data bus width, multiple nibble-based calibration circuits are applied in parallel and synchronized with each other in an ultra-wide data bus memory interface. Such an arrangement will minimize the calibration time and enable a scalable and stackable architecture. Each nibble calibration is implemented as a sequential FSM, where each nibble calibrates all input data bits. Further, all nibbles exchange synchronization information with each other to avoid calibration disruption because of global clock manipulation in one nibble. Further, the calibration time is the maximum time value over a nibble, rather than the time to calibrate all of the data paths of the data bus interface on a bit-by-bit basis.

Figure 1:
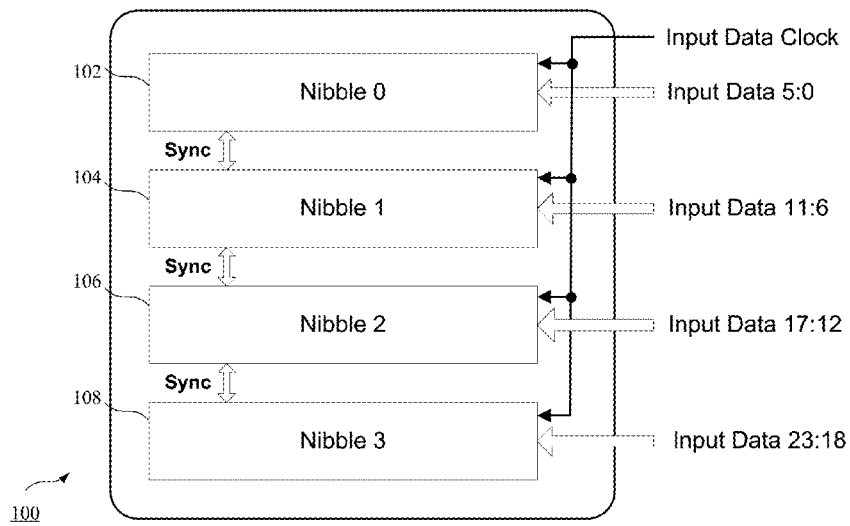
FIG. 1 is block diagram showing a data interface having a plurality of synchronized data receivers each coupled to receive a plurality of bits.

Turning first to FIG. 1, block diagram showing a data interface 100 having a plurality of synchronized data receivers, each coupled to receive a plurality of bits by way of an input data path is shown. The data interface of FIG. 1 comprises a plurality of data receivers coupled to receive an input data clock, where each data receiver is coupled to receive unique data bits associated with a data bus. More particularly, a first data receiver 102 is coupled to receive a first 6-bit nibble of data comprising input data bits [5:0] of an input data bus. A second data receiver 104 is coupled to receive a second 6-bit nibble of data comprising input data bits [11:6] of an input data bus. A third data receiver 106 is coupled to receive a third 6-bit nibble of data comprising input data bits [17:12] of an input data bus. A fourth data receiver 108 is coupled to receive a fourth 6-bit nibble of data comprising input data bits [23:18] of an input data bus. As will be described in more detail below, a control circuit and a clock generation circuit associated with each data transceiver will enable the synchronization of a data paths of the data receivers, and synchronization (sync) signals will be transferred between the data receivers to ensure that the data receivers are synchronized. While 4 receivers are shown receiving 6 bits nibbles of data, it should be understood any number of data receivers could be used to receive data having other data widths.

Figure 2:
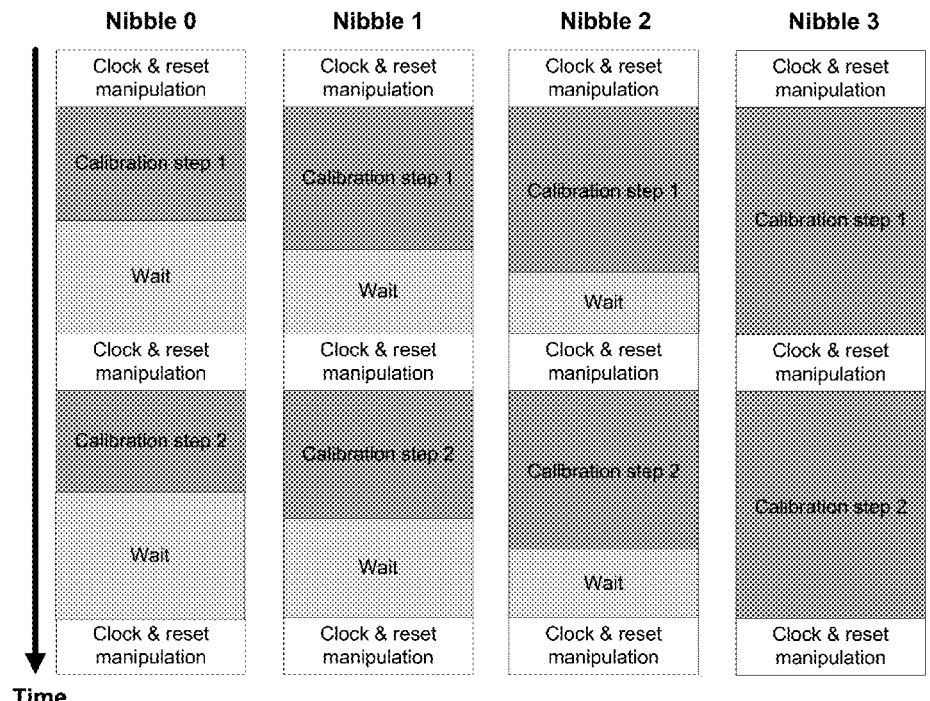
FIG. 2 is timing diagram showing calibration steps for each of the plurality of data receivers of FIG. 1.

Turning now to FIG. 2, a timing diagram show calibration steps for each of the plurality of data receivers of FIG. 1. As can be seen in FIG. 2, two calibration steps are performed, where a second calibration step is not performed until the data receiver for each of the nibbles of data completes the first calibration step. The calibration time for a given calibration step will depend upon the longest calibration of the plurality of data receivers for a given nibble. Therefore, a calibration step will be performed for each nibble (i.e. nibble 0-nibble 3) of data in parallel, where each data receivers waits until the last data receiver finishes the calibration step before a clock and reset manipulation, which will be described in more detail in reference to FIG. 3. While two calibration steps are performed in the example of FIG. 2, it should be understood that fewer or additional calibration steps could be performed.

In the case of inter-nibble or inter-byte clocking, as will be described in more detail below, one nibble is controlling the P/N clock of other nibbles. Therefore, the nibbles must sync in order. If one nibble 0 of local clocking has completed its own calibration, it will turn off its local reference clock signal for the next step. However, it could cause disruption to nibble 1's calibration because nibble 1 may be using a clock from nibble 0 for its calibration. Because one calibration step it could take a different time for a different bit slice to finish its job, inter-nibble syncing is necessary. Because all bit slices are cascaded one-by-one physically, one bit slice has to wait until the previous bit slice to finish its job, so the sync order is always cascaded from head to tail, as shown in FIG. 3.

Figure 3:
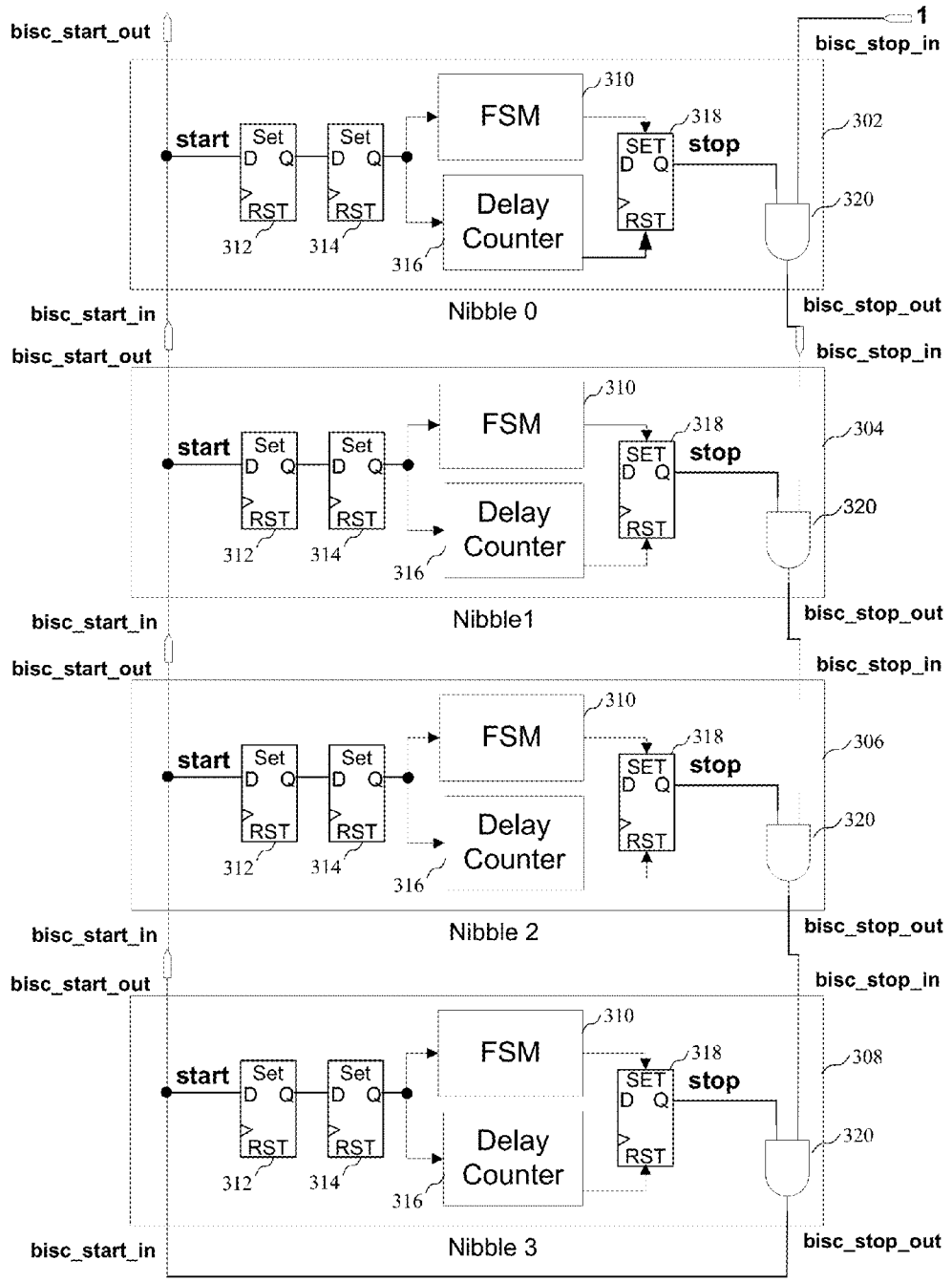
FIG. 3 is block diagram showing the communication of synchronization signals between data receivers of a plurality of data receivers.

Turning now to FIG. 3, a block diagram showing the communication of synchronization signals between data receivers of a plurality of data receivers is shown. A plurality of data receivers 302-308 is coupled to receive and generate control signals which enable the synchronization between the different receivers. Each of the data receivers comprises a FSM 310 coupled to receive the outputs of registers 312 and 314, wherein an input to the register 312 is coupled to receive a start signal. The output of the register 314 is also coupled to a delay counter 316. An output of the FSM 310 is coupled to a set (SET) input of the register 318, and an output of the delay counter 316 is coupled to a reset (RST) input of the register 318, where a stop signal is generated by the register 318. An AND gate 320 is coupled to receive both the stop signal and a bisc_stop_in signal, where the bisc_stop_in signal is bisc_stop_out signal from a previous stage for each data receiver after the first data receiver 302. The delay counter accommodates different frequencies of clock signals into the registers, enabling the register at the output of the FSM 310 to be read at the appropriate time.

The first data receiver 302 receives a bisc_stop_in signal having a logical "1" and a start signal at an input of the register 312 to start the calibration process. After the finite state machine 310 generates a signal at the set input of the register 318 to generate the STOP signal indicating that a calibration step has ended, a bisc_stop_out signal (which is a bisc_stop_in signal for the next stage) is generated. When each calibration step completes, STOP is asserted and waits. STOP propagates through the last nibble when all nibbles complete a step, and is coupled from a last stage 308 as a START signal which propagates to all nibbles. The START signal triggers the FSM 310 to move forward to the next step, where the STOP signal is cleared after FSM is triggered.

By calibrating the multiple bits of the bus in a plurality of nibbles, where a calibration time is equal to the maximum nibble calibration time. Calibration time is reduced compared to previous calibration times, and is equal to N times an average nibble calibration time, where N is the number of nibbles. Accordingly, the architecture enables calibration which is scalable and stackable. More nibbles can easily be accommodated when bus expansion is needed because each nibble is agnostic to system configuration. Any nibble can be skipped if unused to ease system pin assignment.

Figure 4:
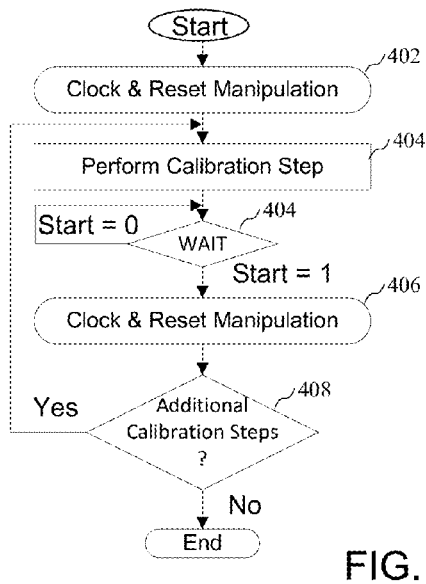
FIG. 4 is flow chart showing the operation of the data receivers of FIGS. 1-3.

Turning now to FIG. 4, a flow chart shows the calibration operation of the data receivers as described in reference to FIGS. 1-3. The clock and reset manipulation performed before each calibration step, as shown in a block 402. The calibration step is then performed at the step 404, wherein a logical "1" for a START signal (i.e. bisc_start_in) is generated after a wait period at a block 404. That is, the calibration waits until a start assertion, which means all nibbles have completed a certain calibration step. Clock and reset manipulation is again performed at a block 406, before it is determined whether additional calibration steps are to be performed at a block 408. If an additional calibration step is required at step 408, the additional calibration step is performed at the step 404.

Figure 5:
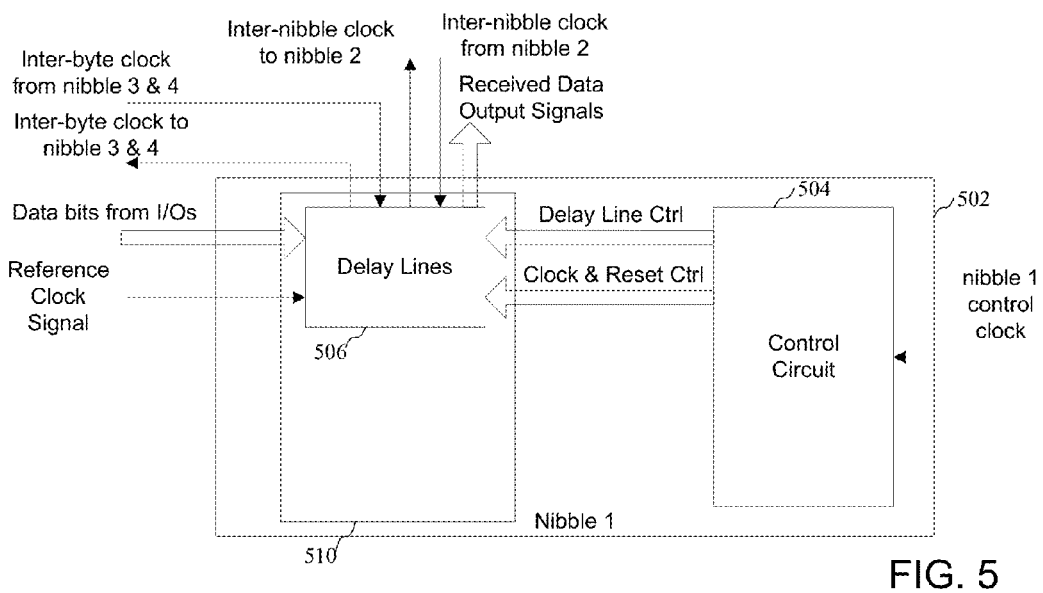
FIG. 5 is a block diagram showing a calibration circuit of a data receiver.

Turning now to FIG. 5, a block diagram showing a calibration circuit of a data receiver is shown. A clock generation circuit 502 comprises a control circuit 504 (for a data receiver associated with nibble 1 as shown for example) coupled to receive a nibble 1 control clock and generate various control signals. More particularly, the control circuit 504 provides delay line control signals and clock and reset control signals to delay lines 506 of a clock circuit 510. Delay lines 506 are coupled to receive a reference clock signal. As will be described in more detail below and particularly in reference to FIG. 8, the delay lines 506 include clock delay elements and data delay elements which provide clock and data signals having a desired timing. As will be described in more detail in reference to FIG. 8, the inter-nibble and inter-byte signals, which are provided to and received from other receives, enable synchronization between the data receivers, where nibble 1 and 2 are associated with a first byte and nibble 3 and 4 are associated with a second byte.

The circuits and methods for receiving data inject a reference clock (i.e. the reference clock signal) into the data and clock paths of each data receiver. Multiplexers enable choosing between allowing the functional data (from an I/O) or the reference clock to be selected. Bit 0 may take in the clock of a source synchronous data while the other bits take in data. The purpose of injecting a reference clock into clock and data paths is to calibrate out delay differences between the clock and data paths as they finally arrive at the sampling registers by adjusting delay values, as will be described in more detail below.

Figure 6:
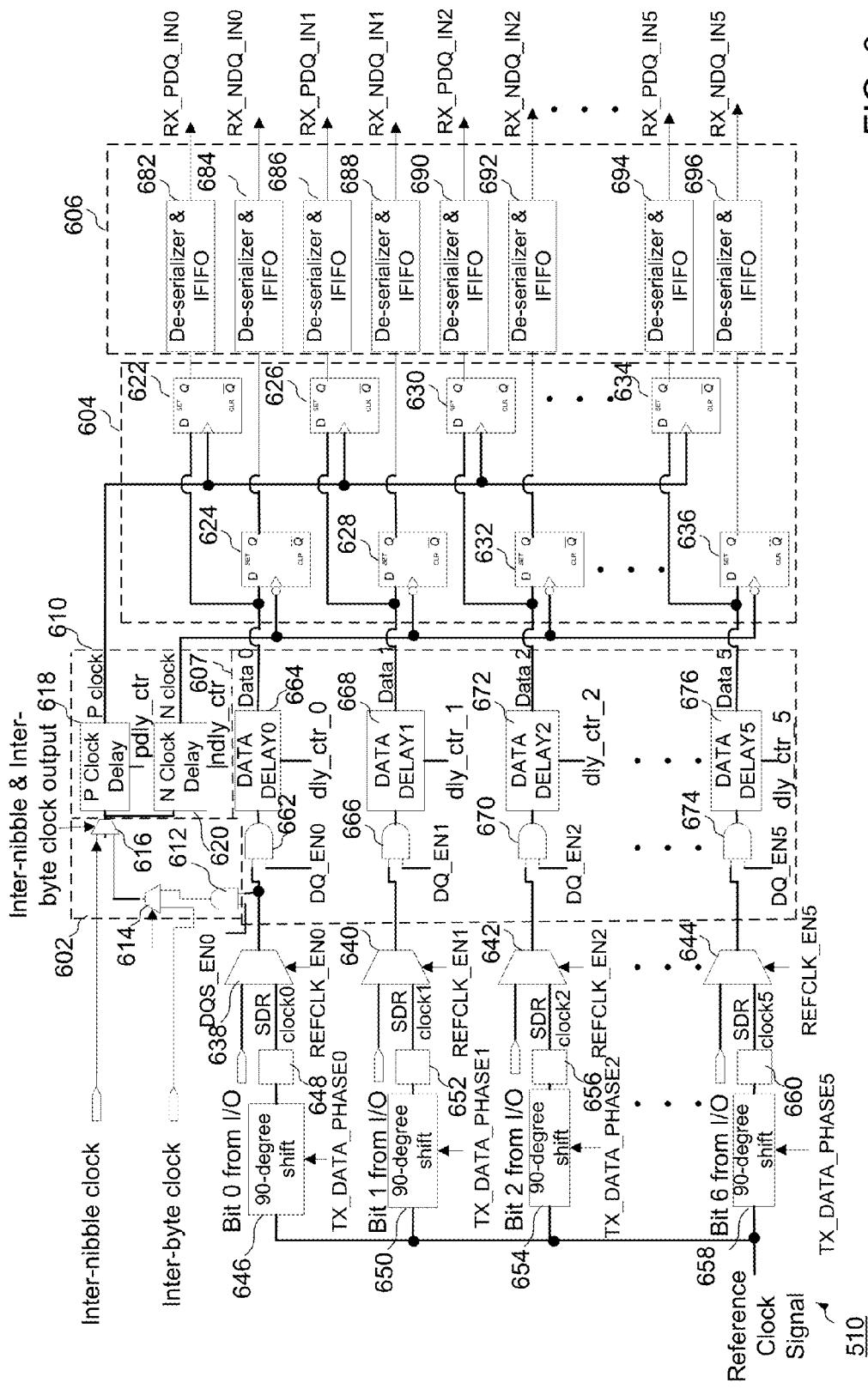
FIG. 6 is block diagram of a clock circuit 510 of FIG. 5 enabling the control of clock and data paths for receiving data at a plurality of input data lines.

Turning now to FIG. 6, a block diagram of the clock circuit 510 enabling the control of clock and data paths for receiving data at a plurality of input data lines is shown. A clock selection circuit 602 is coupled to receive one of various clock signals and control signals for coupling appropriate clock signals to other parts of the circuit. Delayed clock signals are then provided to a register stage 604 having a plurality of registers, the outputs of which are coupled to a deserializer stage 606. In particular, a clock or data signals are coupled from a data delay circuit 607 to registers of the register stage 604. The clock selection circuit 602 comprises a plurality of selection circuits, shown in FIGS. 6 and 7 as multiplexers, which enable the selection of an inter-nibble clock signal, an inter-byte clock signal or a reference clock signal, where a selected clock signal is used for establishing a delay of a delay element of clock generator 610 or a data delay circuit 607 to calibrate the receiver for receiving data.

The clock selection circuit 602 comprises an AND gate 612 coupled to receive a clock signal based upon the reference clock signal at a first input and a data clock enable signal (DQS_EN0) at another input. An output of the AND gate 612 is coupled to an input of a multiplexer 614, which is also coupled to receive an inter-byte clock signal at another input. The output of the multiplexer 614 is coupled to an input of a multiplexer 616, which is coupled to receive an inter-nibble clock at another input. An inter-nibble and inter-byte clock output control signal is coupled to control terminals of the multiplexers 614 and 616. Accordingly, the clock selection circuit enables the routing of a desired clock signal to generate clock signals coupled to registers, as will be described in more detail in reference to FIG. 6. The P and N phases of the selected clock signal are coupled to a P clock delay element 618 and an N clock delay element 620. The outputs of the P slave delay element 618 and the N slave delay element 620 are coupled to clock inputs of corresponding P and N registers of the register stage 604. In particular, the P clock signal is coupled to the clock input of registers 622, 626, 630, and 634, while the N clock signal is coupled to the clock input of registers 624, 628, 632 and 636.

Either a data bit coupled from a corresponding input/output (I/O) of the data path or a phase shifted version of the reference clock signal can be selected for each of a plurality of input data paths (receiving Bit0-Bit1 from an I/O and generating output signals of the deserializer stage 606) by a corresponding multiplexer 638, 640, 642 and 644. In particular, multiplexer 638 is coupled to receive a data bit 0 at a first input and a phase-shifted clock signal received from an output of a phase shifter 646 by way of a divider circuit 648. The phase shifter 646 is controlled by a phase control signal TX_DATA_PHASE0. Multiplexer 640 is coupled to receive data bit 1 at a first input and a phase-shifted clock signal received from an output of a phase shifter 650 by way of a divider circuit 652. The phase shifter 650 is controlled by a phase control signal TX_DATA_PHASE1. Multiplexer 642 is coupled to receive data bit 2 at a first input and a phase-shifted clock signal received from an output of a phase shifter 654 by way of a divider circuit 656. The phase shifter 654 is controlled by a phase control signal TX_DATA_PHASE2. Multiplexer 644 is coupled to receive data bit 5 at a first input and a phase-shifted clock signal received from an output of a phase shifter 658 by way of a divider circuit 660. The phase shifter 658 is controlled by a phase control signal TX_DATA_PHASE5.

The multiplexers 638, 640, 642 and 644 are coupled to receive a corresponding control signal REFCLK_EN signal, where the outputs of the multiplexers 638, 640, 642 and 644 are coupled to a corresponding AND gate and data delay element of the data delay circuit 607. In particular, an AND gate 662 is coupled to receive an output of the multiplexer 638 at a first input, and an enable signal DQ_EN0 at a second input. An output of the AND gate 662 is coupled to the data delay element 664, which generates a DATA 0 output comprising a P data value coupled to a data input of the register 622 and an N data value coupled to a data input of the register 624. An AND gate 666 is coupled to receive an output of the multiplexer 640 at a first input, and an enable signal DQ_EN1 at a second input. An output of the AND gate 666 is coupled to the data delay element 668, which generates a DATA 1 output comprising a P data value coupled to a data input of the register 626 and an N data value coupled to a data input of the register 628. An AND gate 670 is coupled to receive an output of the multiplexer 642 at a first input, and an enable signal DQ_EN2 at a second input. An output of the AND gate 670 is coupled to the delay element 672, which generates a DATA 2 output comprising a P data value coupled to a data input of the register 630 and an N data value coupled to a data input of the register 632. An AND gate 674 is coupled to receive an output of the multiplexer 644 at a first input, and an enable signal DQ_EN5 at a second input. An output of the AND gate 674 is coupled to the data delay element 676, which generates a DATA 5 output comprising a P data value coupled to a data input of the register 634 and an N data value coupled to a data input of the register 636.

The outputs of the registers of the register stage 604 are coupled to the deserializer stage 606 to generate the various receiver output values. In particular, the P data output of the register 622 is coupled to a deserializer and FIFO 682 to generate an output signal RX_PDQ_IN0. The N data output of the register 624 is coupled to a deserializer and FIFO 684 to generate an output signal RX_NDQ_IN0. The P data output of the register 626 is coupled to a deserializer and FIFO 686 to generate an output signal RX_PDQ_IN1. The N data output of the register 628 is coupled to a deserializer and FIFO 688 to generate an output signal RX_NDQ_IN1. The P data output of the register 630 is coupled to a deserializer and FIFO 690 to generate an output signal RX_PDQ_IN2. The N data output of the register 632 is coupled to a deserializer and FIFO 692 to generate an output signal RX_NDQ_IN2. Finally, the P data output of the register 634 is coupled to a deserializer and FIFO 694 to generate an output signal RX_PDQ_IN5. The N data output of the register 636 is coupled to a deserializer and FIFO 696 to generate an output signal RX_NDQ_IN6. The P clock delay 618 and the N clock delay 620 each receive a corresponding control signal pdly_ctr and an ndly_ctr, and the data delay elements receive a corresponding delay control signal, designated dly_ctr_0-dly_ctr_5. The delay control signals are generated by control circuit performing calibration functions, such as the control circuit 504.

As can be seen, the reference clock is injected into the clock and data paths during the calibration. For multiple, independent interfaces across 8 nibbles, which may be associated with different bytes or different portions of a byte for example, varying clocking structures exist to channel clocks of each interface to the correct endpoint sampling register. Once the routes are configured by the multiplexer circuits, the state machine in each nibble can commence to run calibration. Each state machine in a control circuit, such as control circuit 504 of FIG. 5, does not know of the external clock routing, but rather performs calibration until convergence. Each state machine may take different times to complete the calibration, but all state machines must be in sync in order to solve this problem of multiple interfaces per data interface. It should be noted that calibration herein generally refers to internal on-chip calibration, and ignores external effects on the clock and data signals which can be calibrated out by other means. Calibration is required for successful sampling of data by its source synchronous clock. Successful sampling of data requires that all data paths within the IC have identical delays (i.e. minimum skew between them), and that the source synchronous clock arrives centered within the data eye at each sampling register. There will be a delay difference between clock and data because the clock path takes a logically different route than the data path, and this route is dependent on the width of the interface. In addition, logically identical per-bit data lines may vary due to on-chip variation in transistor delays due to local process variations. The on-chip calibration deskews the data bits in each nibble and ensures the sampling clock is centered in the data eye in each nibble, assuming external calibration ensures all external skews are removed. By adjusting the clock and data delay elements, relative skew can be removed by adding delays on either data or clock paths, and the clock signal coupled to the registers enables receiving the data at the center of the eye.

Figure 7:
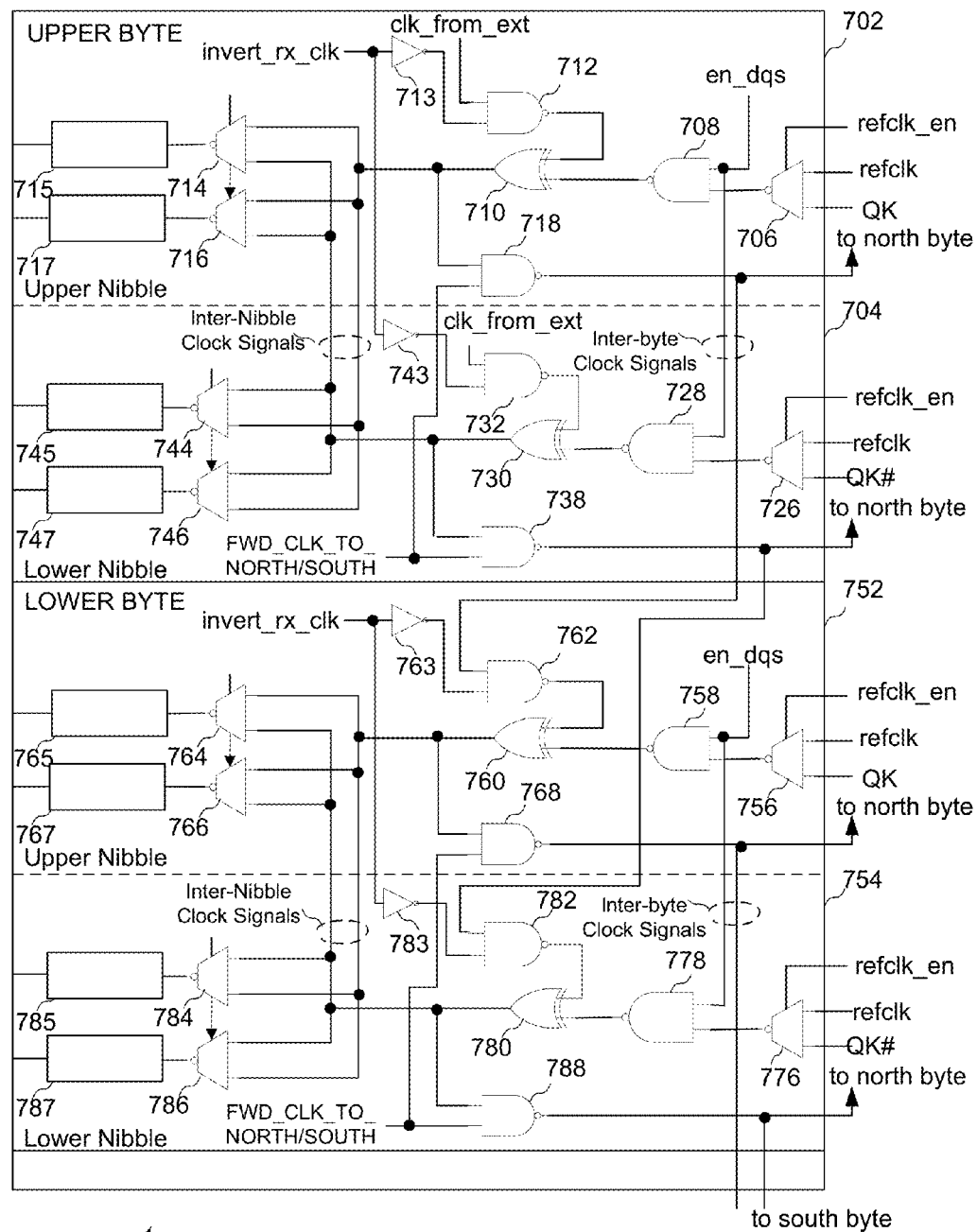
FIG. 7 is block diagram of the clock selection circuit 602 of FIG. 6 showing the use of inter-nibble clock signals and inter-byte clock signals.

Turning now to FIG. 7, a block diagram of the clock selection circuit 602 of FIG. 6 using inter-nibble clock signals and inter-byte clock signals is shown. The circuit of FIG. 7 functions as a routing circuit to enable the routing of inter-nibble clock signals within a receiver receiving a byte, and inter-byte clock signals between receivers receiving bytes. The circuit of FIG. 7 generates clock signals associated with various inputs of data receivers coupled to receive bits from a data bus, shown here as two bytes (i.e. an upper byte and a lower byte). In particular, the circuit comprises a clock generation circuit 702 for receiving data associated with an upper nibble of an upper byte, and a clock generation circuit 704 for receiving data associated with a lower nibble of the upper byte. The clock generation circuit 702 comprises a multiplexer 706 coupled to receive a reference clock signal and an input clock QK, where the multiplexer is controlled by a reference clock enable (refclk_en) signal. The inverted output of the multiplexer is coupled to a first input of a NAND gate 708 which is coupled to receive an enable (en_dqs) signal at a second input. The output of the NAND gate 708 is coupled to a first input of XOR gate 710, which is coupled to receive an output of a NAND gate 712 based upon an invert (invert_rx_clk) signal coupled to a first input by way of an inverter 713, and a clock signal provided to the clock generation circuit 702. The output of the NAND gate 712 is coupled to a second input of the XOR gate 710. The output of the XOR gate 710 is coupled to a first multiplexer 714, the output of which is coupled to a delay element 715. An inter-nibble clock signal from the lower nibble is also coupled to a second input of the multiplexer 714 as will be described in more detail below. The output of the XOR gate 710 is also coupled to an multiplexer 716, the output of which is coupled to a delay element 717. Another inter-nibble clock signal from the lower nibble is coupled to an input of the multiplexer 716. A NAND gate 718 is also coupled to the output of the XOR gate 710 and a clock signal (FWD_CLK_TO NORTH/SOUTH) forwarded from another byte portion, where an output of the NAND gate 718 can be routed to another byte.

The clock generation circuit 704 comprises a multiplexer 726 coupled to receive a reference clock signal and an input clock QK#, where the multiplexer is controlled by a reference clock enable (refclk_en) signal. While QK and QK#, which are off-chip clocks, are described in FIG. 7, any other type of source synchronous clock could be used. The inverted output of the multiplexer is coupled to a first input of a NAND gate 728 which is coupled to receive an enable (en_dqs) signal at a second input. The output of the NAND gate is coupled to a first input of XOR gate 730, which is coupled to receive an output of a NAND gate 732 based upon an invert (invert_rx_clk) signal coupled to a first input by way of an inverter 743, and a clock signal external to the clock generation circuit 704. The output of the NAND gate 732 is coupled to a second input of the XOR gate 730. The output of the XOR gate 730 is coupled to a first multiplexer 744, the output of which is coupled to a delay element 745. A NAND gate 738 is also coupled to the output of the XOR gate 730 and a clock signal (FWD_CLK_TO NORTH/SOUTH) forwarded from another byte portion, where an output of the NAND gate 738 can be routed to another byte. An inter-nibble clock signal will be coupled to a second input of the multiplexer 744 as will be described in more detail below. The output of the XOR gate 730 is also coupled to an multiplexer 746, the output of which is coupled to a delay element 747. Another inter-nibble clock signal from the lower nibble is coupled to an input of the multiplexer 746.

A clock generation circuit for receiving data associated with an upper nibble and a lower nibble of a lower byte is also included. In particular, the circuit comprises a clock generation circuit 752 for receiving data associated with an upper nibble of a lower byte, and a clock generation circuit 754 for receiving data associated with a lower nibble of the lower byte. The clock generation circuit 752 comprises a multiplexer 756 coupled to receive a reference clock signal and an input clock QK, where the multiplexer is controlled by a reference clock enable (refclk_en) signal. The inverted output of the multiplexer is coupled to a first input of a NAND gate 758 which is coupled to receive an enable (en_dqs) signal at a second input. The output of the NAND gate is coupled to a first input of XOR gate 760, which is coupled to receive an output of a NAND gate 762 based upon signal (invert_rx_clk) signal coupled to a first input by way of an inverter 763, and a clock signal external to the clock generation circuit 752. The output of the NAND gate 762 is coupled to a second input of the XOR gate 760. The output of the XOR gate 760 is coupled to a first multiplexer 764, the output of which is coupled to a delay element 765. A NAND gate 768 is also coupled to the output of the XOR gate 760 and a clock signal (FWD_CLK_TO NORTH/SOUTH) forwarded from another byte portion, where an output of the NAND gate 768 can be routed to another byte. An inter-nibble clock signal will be coupled to a second input of the multiplexer 764 as will be described in more detail below. The output of the XOR gate 760 is also coupled to an multiplexer 766, the output of which is coupled to a delay element 767. Another inter-nibble clock signal from the lower nibble is coupled to an input of the multiplexer 766.

The clock generation circuit 754 comprises a multiplexer 776 coupled to receive a reference clock signal and an input clock QK#, where the multiplexer is controlled by a reference clock enable (refclk_en) signal. The inverted output of the multiplexer is coupled to a first input of a NAND gate 778 which is coupled to receive an enable (en_dqs) signal at a second input. The output of the NAND gate is coupled to a first input of XOR gate 780, which is coupled to receive an output of a NAND gate 782 based upon an invert (invert_rx_clk) signal coupled to a first input by way of an inverter 783, and a clock external to the clock generation circuit 754. The output of the NAND gate 782 is coupled to a second input of the XOR gate 780. The output of the XOR gate 780 is coupled to a first multiplexer 784, the output of which is coupled to a delay element 785. A NAND gate 788 is also coupled to the output of the XOR gate 780 and a clock signal (FWD_CLK_TO NORTH/SOUTH) forwarded from another byte portion, where an output of the NAND gate 788 can be routed to another byte. An inter-nibble clock signal will be coupled to a second input of the multiplexer 784 as will be described in more detail below. The output of the XOR gate 780 is also coupled to an multiplexer 786, the output of which is coupled to a delay element 787. Another inter-nibble clock signal from the lower nibble is coupled to an input of the multiplexer 786.

As can be seen, inter-byte and inter-nibble clock signals can be used to enable the reception of data by different data receivers which are synchronized. Inter-byte and inter-nibble clock signals may be selected based upon the implementation of the receivers. During calibration, a clock may be from local reference clock signal (i.e. local clocking) or remote reference clock signal (i.e. inter-nibble/inter-byte clocking). After calibration, a clock may be from local bitslice 0 input pin (i.e. local clocking) or remote bitslice 0 input pin (i.e. inter-nibble/inter-byte clocking). For example, in DDR ×4 receiver mode, every nibble uses local a local clock signal as a P/N clock during calibration, and uses bitslice 0 input pin as a P/N clock after calibration. In DDR ×8 receiver mode, in one byte, nibble 0 uses local reference clock signal as a P/N clock during calibration and uses bitslice 0 input pin as a P/N clock after calibration, while nibble 1 uses a clock from nibble 0 (i.e. an inter-nibble clock which is nibble 0 reference clock signal during calibration and nibble 0 bitslice 0 pin input after calibration) as a P/N clock. In other use cases, nibble 0 of byte 0 may use a local reference clock signal as a P/N clock during calibration and uses bitslice 0 input pin as a P/N clock after calibration and nibble 1 of byte 0 may use a clock from nibble 0 of byte 0 (i.e. inter-nibble clocking) as a P/N clock, while both nibble 0 and nibble 1 in byte 1 may use a clock from nibble 0 of byte 0 (i.e. inter-byte clocking). Because a reference clock signal is always located at bitslice 0 pin input, after calibration a P/N clock is from either a local bitslice 0 input pin or a remote bitslice 0 input pin (i.e. inter-nibble or inter-byte clocking).

One wide interface may span multiple nibbles and/or bytes. That is, one clock is used for receiving many data bits. Alternatively, there may be multiple independent narrow interfaces that can wholly reside in their own independent nibbles, or a mix of wide and narrow interfaces. For a wide interface, the single clock will enter bit0 of one of the nibbles, and needs to travel to other nibbles to clock the data entering them. Inter-nibble clocking is used when data occupies two nibbles in same byte, where the clock only travels from one nibble to the other. For the remaining data bits in other bytes, inter-byte clocking may be used to channel the source clock to a nibble in another byte. Once this source clock enters a nibble in an external byte, it can be provided on the inter-nibble clocking to an adjacent nibble in same byte. When an inter-nibble clock is used, the reference clock is injected into the clock path at the source nibble and must travel further to get to an external nibble. Therefore, the skew of the clock versus data in the external nibble will be greater than if the reference clock had been injected locally to that external nibble, such as for a single-nibble wide interface.

Figure 8:
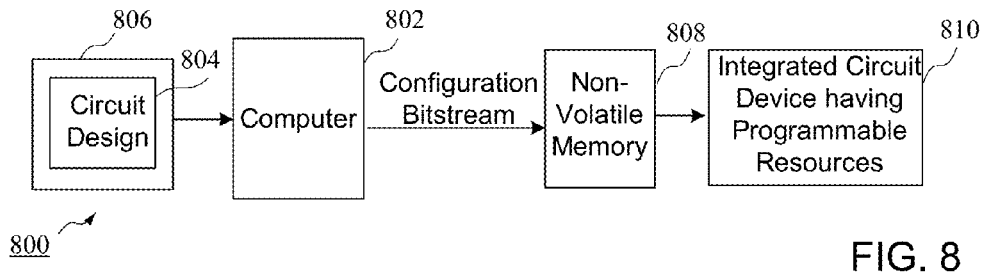
FIG. 8 is a block diagram of a system for programming a device having programmable resources.

Turning now to FIG. 8, a block diagram of a system for programming a device having programmable resources according to an implementation is shown. In particular, a computer 802 is coupled to receive a circuit design 804 from a memory 806, and generates a configuration bitstream which is stored in the non-volatile memory 806. As will be described in more detail below, the circuit design may be a high level design, such as a circuit design defined in a hardware description language (HDL). Also, the computer may be configured to run software that generates a configuration bitstream which is stored in the non-volatile memory 808 and provided to an integrated circuit 810 which may be a programmable integrated circuit, such as the integrated circuit described below in FIG. 9. As will be described in more detail below, bit of the configuration bitstream are used to configure programmable resources of the integrated circuit.

Figure 9:
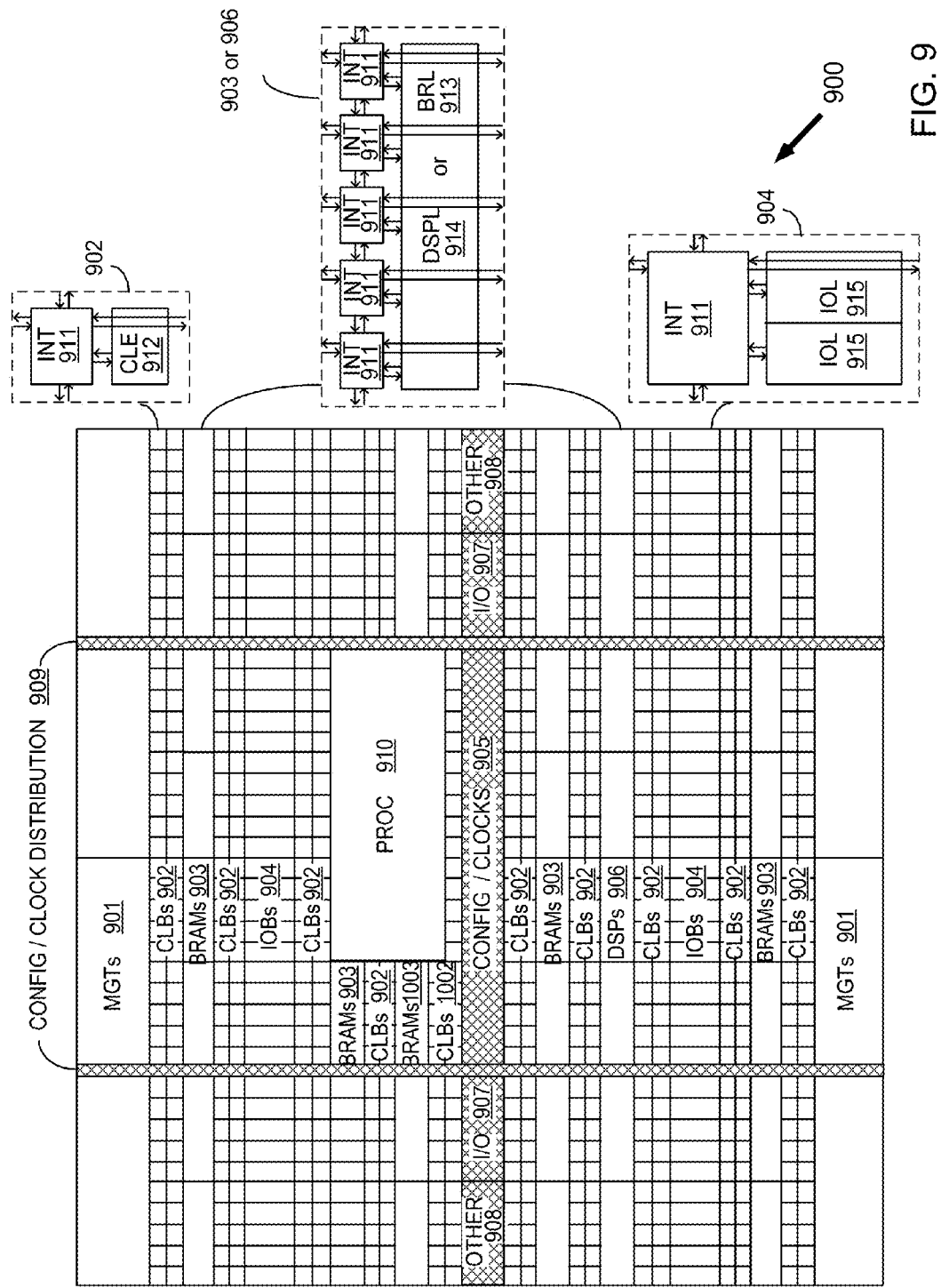
FIG. 9 is a block diagram of a device having programmable resources which may implement the circuits of FIGS. 1-7.

Turning now to FIG. 9, a block diagram of a device having programmable resources including the circuits of FIGS. 1-7 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 9 comprises an FPGA architecture 900 having a large number of different programmable tiles including multi-gigabit transceivers (MGTs) 901, CLBs 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910, which may be used to implement a software application, for example.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element 911 also includes the connections to and from the programmable logic element within the same tile, as shown by the examples included at the top of FIG. 9.

For example, a CLB 902 may include a configurable logic element (CLE) 912 that may be programmed to implement user logic plus a single programmable interconnect element 911. A BRAM 903 may include a BRAM logic element (BRL) 913 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 906 may include a DSP logic element (DSPL) 914 in addition to an appropriate number of programmable interconnect elements. An IOB 904 may include, for example, two instances of an input/output logic element (IOL) 915 in addition to one instance of the programmable interconnect element 911. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 909 extending from this column are used to distribute the clocks and configuration signals across the breadth of the FPGA. Some FPGAs utilizing the architecture illustrated in FIG. 9 include additional logic blocks that disrupt the regular columnar structure making up a large part of the FPGA. The additional logic blocks may be programmable blocks and/or dedicated logic. For example, the processor block PROC 910 shown in FIG. 9 spans several columns of CLBs and BRAMs.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual FPGA more than one adjacent column of CLBs is typically included wherever the CLBs appear in order to facilitate the efficient implementation of user logic. While the implementation of FIG. 9 relates to an integrated circuit having programmable resources, it should be understood that the circuits and methods set forth in more detail below could be implemented in any type of ASIC.

Figure 10:
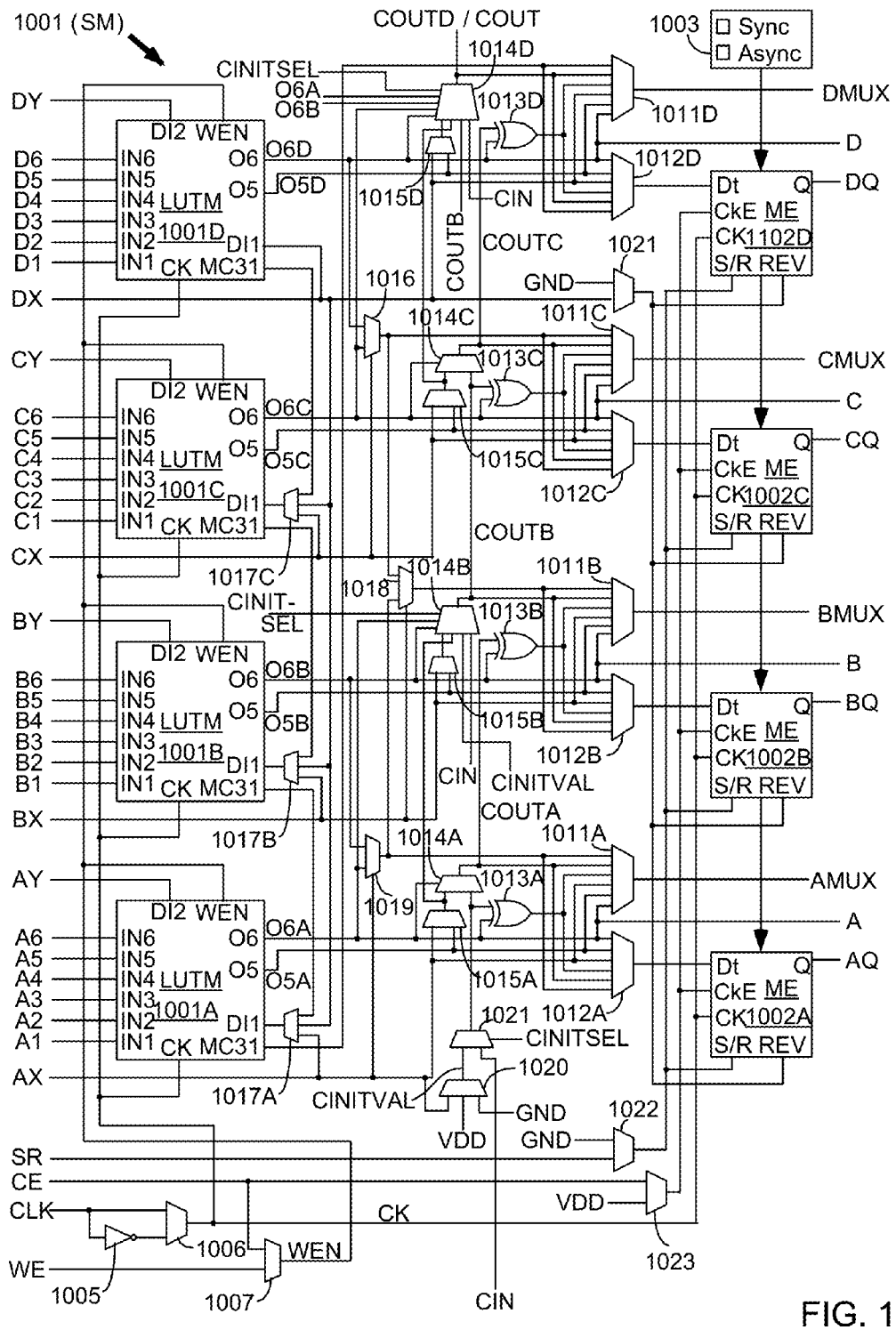
FIG. 10 is a block diagram of a configurable logic element of the device of FIG. 9.

Turning now to FIG. 10, block diagram of a configurable logic element of the device of FIG. 9 is shown. In particular, FIG. 10 illustrates in simplified form a configurable logic element of a configuration logic block 902 of FIG. 9. In the implementation of FIG. 10, slice M 1001 includes four lookup tables (LUTMs) 1001A-1001D, each driven by six LUT data input terminals A1-A6, B1-B6, C1-C6, and D1-D6 and each providing two LUT output signals O5 and O6. The O6 output terminals from LUTs 1001A-1001D drive slice output terminals A-D, respectively. The LUT data input signals are supplied by the FPGA interconnect structure via input multiplexers, which may be implemented by programmable interconnect element 1011, and the LUT output signals are also supplied to the interconnect structure. Slice M also includes: output select multiplexers 1011A-1011D driving output terminals AMUX-DMUX; multiplexers 1012A-1012D driving the data input terminals of memory elements 1002A-1002D; combinational multiplexers 1016, 1018, and 1019; bounce multiplexer circuits 1022-1023; a circuit represented by inverter 1005 and multiplexer 1006 (which together provide an optional inversion on the input clock path); and carry logic having multiplexers 1014A-1014D, 1015A-1015D, 1020-1021 and exclusive OR gates 1013A-1013D. All of these elements are coupled together as shown in FIG. 10. Where select inputs are not shown for the multiplexers illustrated in FIG. 10, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 10 for clarity, as well as from other selected figures herein.

In the pictured implementation, each memory element 1002A-1002D may be programmed to function as a synchronous or asynchronous flip-flop or latch. The selection between synchronous and asynchronous functionality is made for all four memory elements in a slice by programming Sync/Asynch selection circuit 1003. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1002A-1002D are clocked by a clock signal CK, which may be provided by a global clock network or by the interconnect structure, for example. Such programmable memory elements are well known in the art of FPGA design. Each memory element 1002A-1002D provides a registered output signal AQ-DQ to the interconnect structure. Because each LUT 1001A-1001D provides two output signals, O5 and O6, the LUT may be configured to function as two 5-input LUTs with five shared input signals (IN1-IN5), or as one 6-input LUT having input signals IN1-IN6.

In the implementation of FIG. 10, each LUTM 1001A-1001D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1017A-1017C for LUTs 1001A-1001C), or to the two 32-bit RAMs via input terminals DI1 and DI2. RAM write operations in the LUT RAMs are controlled by clock signal CK from multiplexer 1006 and by write enable signal WEN from multiplexer 1007, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1001A may also be provided to the general interconnect structure for shift register chaining, via output select multiplexer 1011D and CLE output terminal DMUX. Accordingly, the circuits and methods set forth above may be implemented in a device such as the devices of FIGS. 9 and 10, or any other suitable device.

Figure 11:
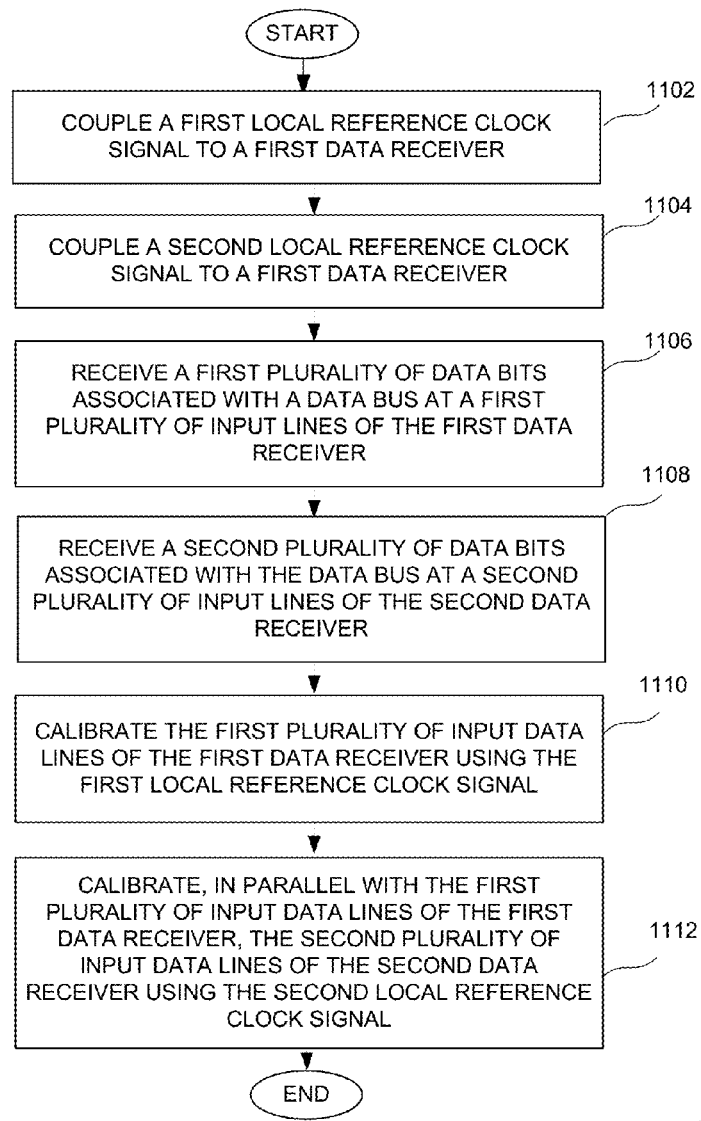
FIG. 11 is a flow diagram showing a method of enabling receiving data in an integrated circuit by calibrating first and second pluralities of data lines in parallel.

Turning now to FIG. 11, a flow chart shows a method of enabling the calibration of a data receiver in an integrated circuit. In particular, s first local reference clock signal are coupled to a first data receiver at a step 1102. A second local reference clock signal are coupled to a first data receiver at a step 1104. A first plurality of data bits associated with a data bus are received at a first plurality of input lines of the first data receiver at a step 1106. A second plurality of data bits associated with the data bus are received at a second plurality of input lines of the second data receiver at a step 1108. The first plurality of input data lines of the first data receiver are calibrated using the first local reference clock signal at a step 1110. The second plurality of input data lines of the second data receiver using the second local reference clock signal are calibrated in parallel with the first plurality of input data lines of the first data receiver at a step 1112.

Figure 12:
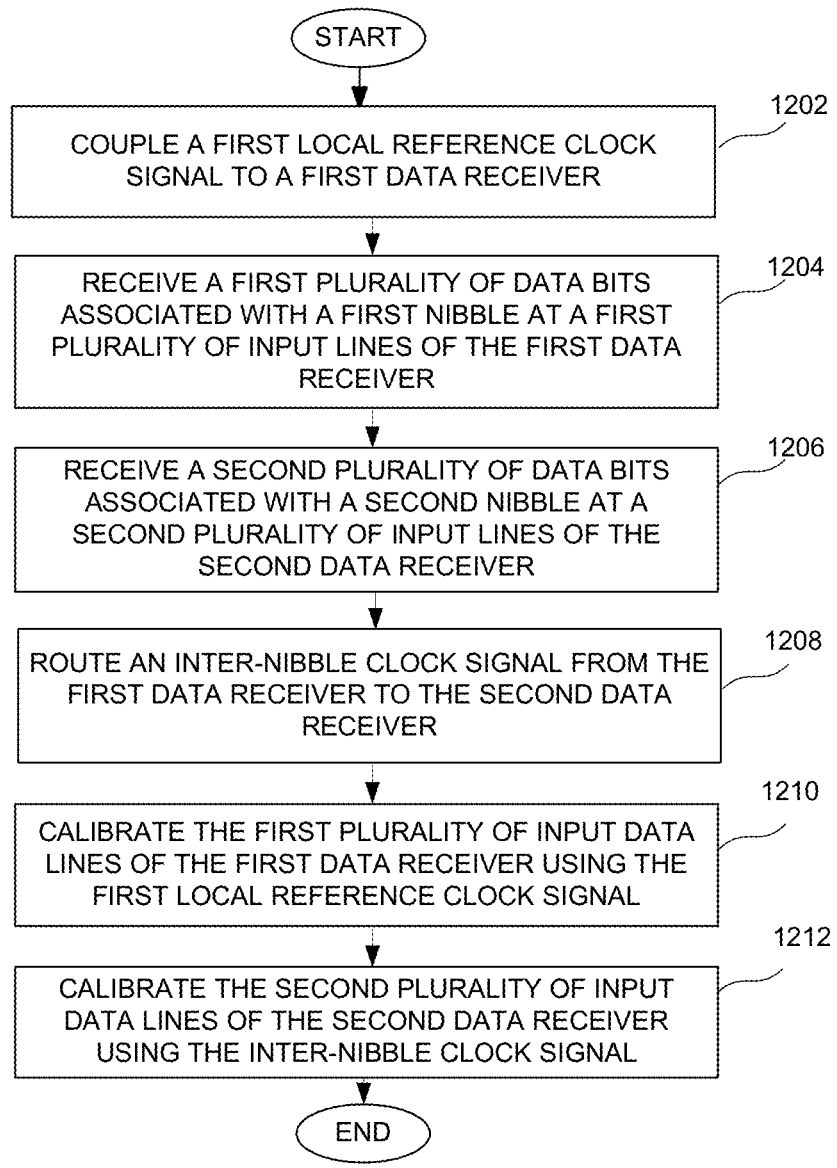
FIG. 12 is another flow chart showing a method of enabling receiving data in an integrated circuit by implementing an inter-nibble clock signal.

Turning now to FIG. 12, a flow chart shows a method of enabling the calibration of a data receiver in an integrated circuit by using an inter-nibble clock signal. In particular, a first local reference clock signal are coupled to a first data receiver at a step 1202. A first plurality of data bits associated with a first nibble are received at a first plurality of input lines of the first data receiver at a step 1204. A second plurality of data bits associated with a second nibble are received at a second plurality of input lines of the second data receiver at a step 1206. An inter-nibble clock signal is routed from the first data receiver to the second data receiver at a step 1208. The first plurality of input data lines of the first data receiver are calibrated using the first local reference clock signal at a step 1210. The second plurality of input data lines of the second data receiver are calibrated using the inter-nibble clock signal at a step 1212.

Figure 13:
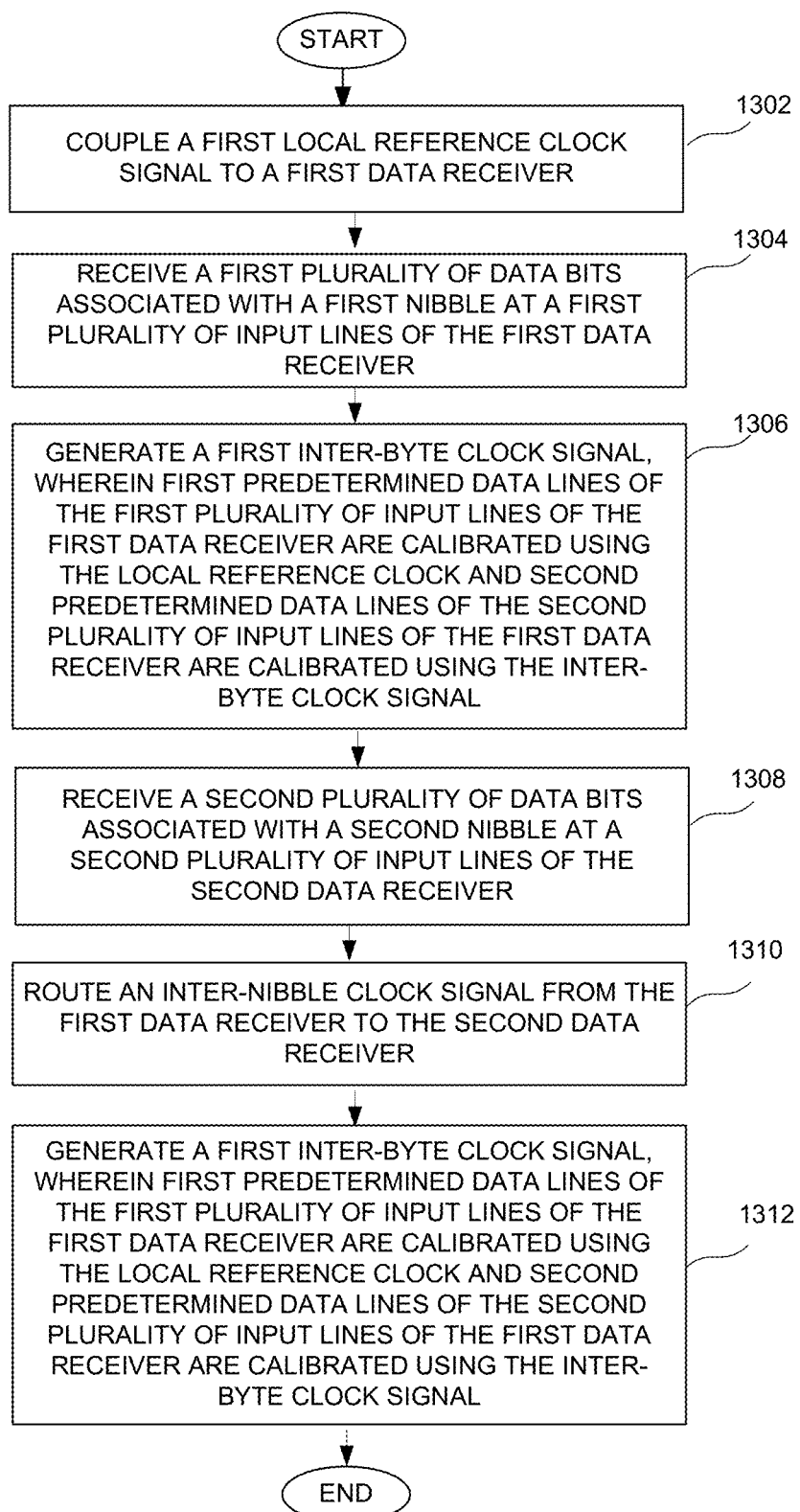
FIG. 13 is another flow chart showing a method of enabling receiving data in an integrated circuit by implementing inter-nibble and inter-byte clock signals.

Turning now to FIG. 13, a flow chart shows a method of enabling the calibration a data receiver in an integrated circuit by using inter-nibble and inter-byte clock signals. In particular, A first local reference clock signal are coupled to a first data receiver at a step 1302. A first plurality of data bits associated with a first nibble are received at a first plurality of input lines of the first data receiver at a step 1304. A first inter-byte clock signal are generated at a step 1306, wherein first predetermined data lines of the first plurality of input lines of the first data receiver are calibrated using the local reference clock and second predetermined data lines of the second plurality of input lines of the first data receiver are calibrated using the inter-byte clock signal. A second plurality of data bits associated with a second nibble are received at a second plurality of input lines of the second data receiver at a step 1308. An inter-nibble clock signal from the first data receiver are routed to the second data receiver at a step 1310. A first inter-byte clock signal are generated at a step 1312, wherein first predetermined data lines of the first plurality of input lines of the first data receiver are calibrated using the local reference clock and second predetermined data lines of the second plurality of input lines of the first data receiver are calibrated using the inter-byte clock signal.

The various elements of the methods of FIGS. 11 and 12 may be implemented using the circuits of FIGS. 1-10 as described, or using some other suitable circuits. While specific elements of the method are described, it should be understood that additional elements of the method, or additional details related to the elements, could be implemented according to the disclosure of FIGS. 1-10.

It can therefore be appreciated that new circuits for and methods of implementing a data transceiver in an integrated circuit has been described. It will be appreciated by those skilled in the art that numerous alternatives and equivalents will be seen to exist which incorporate the disclosed invention. As a result, the invention is not to be limited by the foregoing implementations, but only by the following claims.

What is claimed is:

1. A data interface enabling the calibration of circuits receiving input data, the data interface comprising:
    a first data receiver having a first plurality of input data lines coupled to receive a corresponding first plurality of data bits associated with a data bus, the first data receiver having a first control circuit enabling a calibration of the first plurality of input data lines; and
    a second data receiver having a second plurality of input data lines coupled to receive a corresponding second plurality of data bits associated with the data bus, the second data receiver having a second control circuit enabling a calibration of the second plurality of input data lines;
    wherein the first plurality of input data lines of the first data receiver are calibrated in parallel with the second plurality of input data lines of the second data receiver; and
    wherein the first data receiver receives a first local reference clock signal.

2. The data interface of claim 1, further comprising:
    a routing circuit of the first data receiver coupled to the second data receiver;
    wherein the first plurality of input data lines is calibrated using the first local reference clock signal, and a clock signal from the routing circuit of the first data receiver is provided to the second data receiver; and
    wherein the second plurality of input data lines is calibrated using the clock signal from the first data receiver.

3. The data interface of claim 1, further comprising:
    a second local reference clock signal coupled to the second data receiver;
    wherein the first plurality of input data lines is calibrated using the first local reference clock signal;
    wherein the second plurality of input data lines is calibrated using the second local reference clock signal.

4. The data interface of claim 1, wherein the first data receiver comprises:
    a clock delay element for generating a clock signal coupled to a register of each input data line of the first plurality of input data lines; and
    a first plurality of data delay elements corresponding to the first plurality of input data lines.

5. The data interface of claim 4, wherein the first data receiver generates, after a first calibration step is completed, a stop signal that is coupled to the second data receiver.

6. The data interface of claim 1, wherein:
the first data receiver and the second data receiver are a part of a plurality of data receivers extending from the first data receiver to a last data receiver; and
a stop signal generated by the last data receiver enables generating a start signal coupled to each data receiver of the plurality of data receivers after the first calibration step is completed by the last data receiver.

7. A data interface enabling the calibration of circuits receiving input data, the data interface comprising:
a first data receiver having a first plurality of input data lines coupled to receive a corresponding first nibble of data associated with a data bus and to receive a reference clock signal, the first data receiver comprising a routing circuit for generating an inter-nibble clock signal; and
a second data receiver having a second plurality of input data lines coupled to receive a corresponding second nibble of data associated with the data bus and to receive the inter-nibble clock signal from the first data receiver;
wherein the first plurality of input data lines are calibrated using the reference clock signal, and the second plurality of input data lines are calibrated using the inter-nibble clock signal.

8. The data interface of claim 7, wherein:
the routing circuit comprises an first byte portion and a second byte portion; and
the routing circuit routes an inter-byte clock signal from the first byte portion to the second byte portion.

9. The data interface of claim 7, wherein the routing circuit comprises a selection circuit enabling the selection of an inter-nibble clock signal and an inner-byte clock signal.

10. The data interface of claim 7, wherein the first plurality of input data lines and the second plurality of input data lines are calibrated in parallel.

11. The data interface of claim 7, wherein the first data receiver comprises:
a clock delay element for providing a clock signal coupled to a register of each input data line of the first plurality of input data lines; and
a first plurality of data delay elements corresponding to the first plurality of input data lines.

12. The data interface of claim 11, wherein the first data receiver generates, after a first calibration step is completed, a stop signal that is coupled to the second data receiver.

13. The data interface of claim 8, wherein:
the first data receiver and the second data receiver are a part of a plurality of data receivers extending from the first data receiver to a last data receiver; and
the stop signal generated by the last data receiver enables generating a start signal coupled to each data receiver of the plurality of data receivers after the first calibration step is completed by the last data receiver.

14. A method of enabling the calibration of circuits receiving input data, the method comprising:
receiving a first plurality of data bits associated with a data bus at a first plurality of input data lines of a first data receiver;
receiving a second plurality of data bits associated with the data bus at a second plurality of input data lines of a second data receiver;
calibrating the first plurality of input data lines of the first data receiver in parallel with the second plurality of input data lines of the second data receiver;
receiving a local reference clock signal at the first data receiver; and
wherein the first plurality of input data lines is calibrated using the local reference clock signal.

15. The method of claim 14, further comprising:
receiving, from the first data receiver, a second clock signal at the second data receiver;
wherein the second plurality of input data lines is calibrated using the second clock signal.

16. The method of claim 14, wherein:
receiving a first plurality of data bits associated with a data bus at a first plurality of input data lines comprises receiving a first byte of data;
first predetermined input data lines of the first plurality of input data lines receiving a first nibble of the first byte of data are calibrated using the reference clock signal; and
second predetermined input data lines of the first plurality of input data lines receiving a second nibble of the first byte of data are calibrated using an inter-nibble clock signal.

17. The method of claim 16, wherein:
receiving a second plurality of data bits associated with the data bus at a second plurality of input data lines comprises receiving a second byte of data; and
the second plurality of input data lines are calibrated using an inter-byte clock signal.

18. The method of claim 14, further comprising:
generating, at the first data receiver after a first calibration step is completed, a stop signal that is coupled to the second data receiver;
wherein the first data receiver and the second data receiver are a part of a plurality of data receivers extending from the first data receiver to a last data receiver; and
wherein a stop signal generated by the last data receiver enables generating a start signal coupled to each data receiver of the plurality of data receivers after the first calibration step is completed by the last data receiver.

* * * * *